United States Patent [19]
Kadono et al.

[11] Patent Number: 5,140,323
[45] Date of Patent: Aug. 18, 1992

[54] DIGITAL SIGNAL ORTHOGONAL TRANSFORMER APPARATUS

[75] Inventors: Shinya Kadono, Katano; Tatsuro Juri, Osaka, both of Japan

[73] Assignee: Matsushita Electric Industrial Co., Ltd., Osaka, Japan

[21] Appl. No.: 741,049

[22] Filed: Aug. 6, 1991

[30] Foreign Application Priority Data

Aug. 6, 1990 [JP] Japan ................. 2-208604

[51] Int. Cl.$^5$ ................. H03M 7/16; H03M 7/40
[52] U.S. Cl. ................. 341/98; 341/67; 341/93; 358/433
[58] Field of Search ................. 341/98, 67, 50, 93; 358/133, 134, 135, 136, 432, 433, 426; 364/727, 725; 375/122, 38, 34, 37, 39

[56] References Cited

U.S. PATENT DOCUMENTS

| | | | |
|---|---|---|---|
| 4,580,162 | 4/1986 | Mori | 358/135 |
| 4,922,273 | 5/1990 | Yonekawa et al. | 358/429 |
| 4,954,892 | 9/1990 | Asai et al. | 358/133 |
| 5,016,010 | 5/1991 | Sugiyama | 341/67 |
| 5,040,054 | 8/1991 | Schmidt et al. | 358/29 |

*Primary Examiner*—Sharon D. Logan
*Attorney, Agent, or Firm*—Wenderoth, Lind & Ponack

[57] ABSTRACT

As an orthogonally transformed signal carries a value adjacent to zero, the output of an orthogonal transformer is coupled in series to a fixed length code encoder for converting the orthogonally transformed signal into a fixed length code signal which exhibits less bit inversion between positive and negative signals near zero. The orthogonal transformer and the fixed length code encoder constitute in combination an orthogonal transformer device.

8 Claims, 4 Drawing Sheets

| DECIMAL | 2'S COM | ABS | GRAY1 | GRAY2 |
|---------|---------|-------|-------|-------|
| -8 | 11000 | 11000 | 10100 | 00000 |
| -7 | 11001 | 10111 | 10101 | 00001 |
| -6 | 11010 | 10110 | 10111 | 00011 |
| -5 | 11011 | 10101 | 10110 | 00010 |
| -4 | 11100 | 10100 | 10010 | 00110 |
| -3 | 11101 | 10011 | 10011 | 00111 |
| -2 | 11110 | 10010 | 10001 | 00101 |
| -1 | 11111 | 10001 | 10000 | 00100 |
| 0  | 00000 | 00000 | 00000 | 01100 |
| 1  | 00001 | 00001 | 00001 | 01101 |
| 2  | 00010 | 00010 | 00011 | 01111 |
| 3  | 00011 | 00011 | 00010 | 01110 |
| 4  | 00100 | 00100 | 00110 | 01010 |
| 5  | 00101 | 00101 | 00111 | 01011 |
| 6  | 00110 | 00110 | 00101 | 01001 |
| 7  | 00111 | 00111 | 00100 | 01000 |
| 8  | 01000 | 01000 | 01100 | 11000 |

DIGITAL SIGNAL ORTHOGONAL TRANSFORMER APPARATUS

BACKGROUND OF THE INVENTION

1. Field of the Invention

The present invention relates to an orthogonal transformer apparatus for use in high efficiency encoding of digital signals, e.g. a digital video signal or a digital audio signal.

2. Description of the Prior Art

It is known that two's complement signals are employed for data transmission between an orthogonal transformer and an encoder in a conventional orthogonal transformer device. The two's complement signals can easily be processed by arithmetic operations including addition, subtraction, multiplication, and division, whereby an arrangement of hardware for performing the operations will be simple. Although there are a variety of methods for expressing numbers, they will be more intricate in arithmetic operation than the two's complement signals and not commonly used in arithmetic operating apparatuses. However, two's complement input signals which have high correlation, e.g. video signals, tend to appear in proximity to zero when having been processed by orthogonal transformation. In particular, whenever a two's complement signal is changed from positive to negative or vice versa, almost all 1 and 0 bits of the signal will be inverted. As the result, the inversion of 1 and 0 bits causes unwanted changes in the current and voltage during transmission of such signals carrying values proximal to zero, thus causing noise signals in the apparatus.

SUMMARY OF THE INVENTION

It is an object of the present invention to reduce noises caused during data transmission by attenuating bit inversion of signals while being transferred from an orthogonal transformer to a variable length code encoder and from a variable length code decoder to an orthogonal transformer and thus, to minimize noise in the entire circuit system.

For achievement of the foregoing object, an orthogonal transformer device according to the present invention comprises an orthogonal transformer for processing a digital blocked signal of two's complement by orthogonal transformation, and a fixed length code encoder for converting the two's complement signal orthogonal transformed by the orthogonal transformer into a fixed length code signal which exhibits less bit inversion between positive and negative signals near zero.

Also, another orthogonal transformer device of the present invention comprises a fixed length code decoder for converting an input signal exhibiting less bit inversion between positive and negative signals near zero into a digital signal of two's complement, and an orthogonal transformer for processing the digital signal of two's complement decoded by the fixed length code decoder by orthogonal transformation.

Using the fixed length code encoder for converting an input signal to a fixed length code signal which exhibits less bit inversion between positive and negative signals near zero, noise signals generated during transmission by the action of current and/or voltage change resulting from bit inversion can be decreased as compared with the use of two's complement signals. According to the present invention, the fixed length code encoder for encoding an output signal of the orthogonal transformer is coupled to the output of the orthogonal transformer so that the inversion of signal bits produced during signal transmission from the orthogonal transformer device to a remote encoder can be minimized. In construction, the fixed length code encoder is composed of simple hardware arrangement.

There is also a reverse event in which input signals to an orthogonal transformer device carry values proximal to zero. For example, video signals which have high correlation have been orthogonal transformed and fed to the orthogonal transformer device. If the input signal is of two's complement notation, it contains a large number of inverted bits and thus, should be encoded to a code signal which exhibits less bit inversion between positive and negative signals near zero for attenuating the development of noise. For orthogonal transformation of such code signals, the fixed length code decoder for decoding the code signal back to a two's complement signal is coupled to the input of the orthogonal transformer which in turn processes the two's complement signal from the fixed length code decoder by orthogonal transformation. As the orthogonal transformer device comprises the fixed length code decoder and the orthogonal transformer, noise resulting from bit invention will be minimized.

DESCRIPTION OF THE PREFERRED EMBODIMENTS

Figure 1:
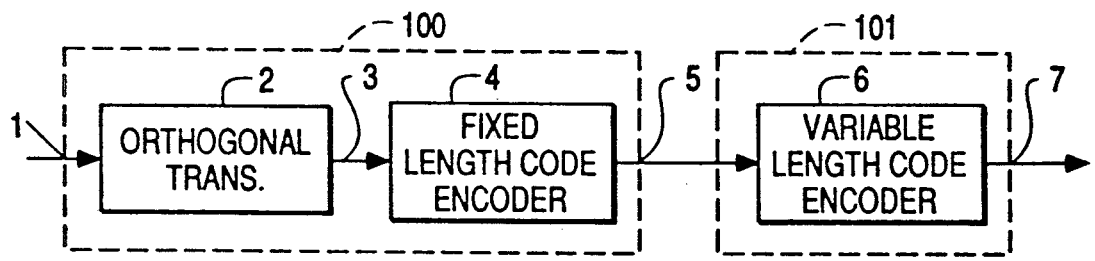
FIGS. 1 and 2 are block diagrams of an orthogonal transformer device showing a first embodiment of the present invention.

FIG. 1 is a block diagram of an orthogonal transformer device showing a first embodiment of the present invention. Shown in FIG. 1 are an input signal 1 expressed in two's complement, an orthogonal transformer 2 for processing the input signal by orthogonal transformation, an output signal 3 from the orthogonal transformer 2, a fixed length code encoder 4 for encoding the output signal 3 into a fixed length code, a code signal 5 produced at the fixed length code encoder 4, a variable length code encoder 6 for converting the code signal 5 into a variable length code form, and a code signal 7 produced at the variable length code encoder 6. In particular, the orthogonal transformer 2 and the fixed length code encoder 4 constitute in combination an orthogonal transformer device 100 of the present invention. Each group of components defined by a rectangular shape of the dotted line in FIG. 1 represents a fundamental unit arranged on e.g. a single integrated circuit chip.

Figure 2:
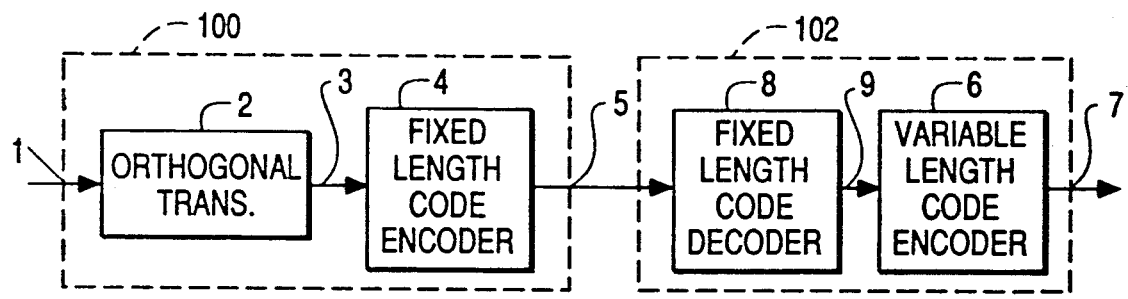

The operation of the foregoing arrangement illustrated in FIG. 1 will now be explained. The input signal 1 expressed in two's complement is processed by orthogonal transformation at the orthogonal transformer 2. The orthogonal transformation may be executed of an audio signal by Fourier transformation and of a video signal by a Hadamard technique or cosine transformation. If the input signal 1 has high correlation, the output signal 3 exhibits a close concentration of the data in proximity to zero. The output signal 3 is now given in the form of two's complement which is easily processed by arithmetic operations including addition, subtraction, multiplication, and division. Then, the output signal 3 is converted by the fixed length code encoder 4 into a specific code form, e.g. a signed absolute value code or Gray code, both described later, which exhibits less bit inversion. The less the inversion of bits, the smaller a change in the value of a signal caused during transmission. As the result, noise developed during the transmission of signals from the orthogonal transformer device to the variable length code encoder will be minimized. The code signal 5 carrying less bit inverted codes is released as an output of the orthogonal transformer device. It would be understood that the fixed length code encoder 4 which is smaller in the hardware scale than the variable length code encoder 6 is easily arranged in association with the orthogonal transformer 2 on a single element (e.g. IC chip) so that the effect of noise resulting from the positive/negative inversion of codes in the output signal 3 will be negligible. If the arrangement of a variable length code encoder device is only needed for processing a signal similar in type to the code signal 5, it can be substituted with the variable length code encoder 6. Hence, the arrangement for performing the orthogonal transformation according to the present invention is increased in the overall hardware scale by a size of the fixed length code encoder 4. In case that the variable length code encoder has to process two's complement codes, it may be composed of a variable length code encoder 6 and a fixed length code decoder 8 forming a unit denoted by 102 as shown in FIG. 2. In operation, the output signal 5 is decoded by the fixed length code decoder 8 to a two's complement signal 9 which is then encoded by the variable length code encoder 6. Accordingly, the same result will be obtained as of the usual arrangement shown in FIG. 1 in which the output signal 3 of the orthogonal transformer 2 is converted by the variable length code encoder 6 to a variable length code.

Figures 3, 5:
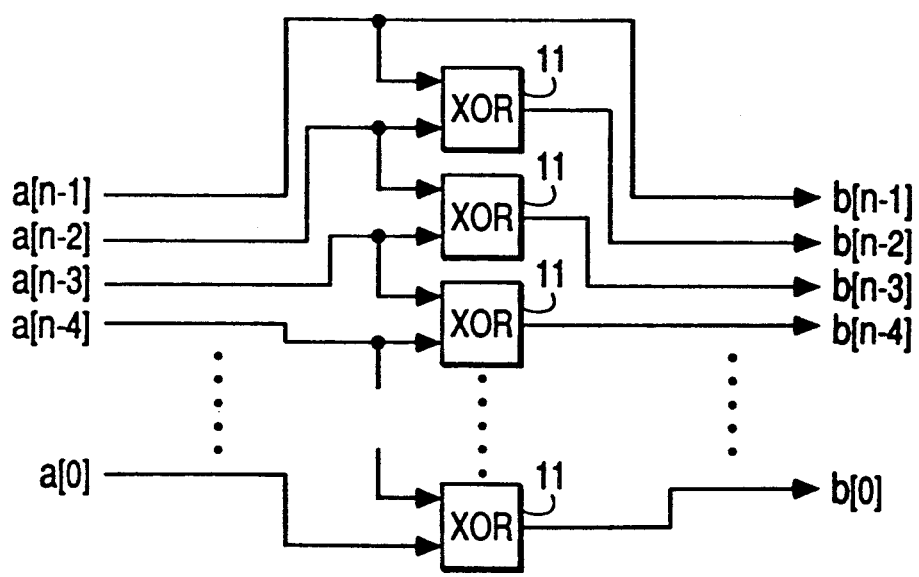
FIG. 3 is a table showing a set of fixed length codes for use with the present invention.

The conversion of a two's complement code into a specific fixed length code which exhibits less bit inversion between positive and negative signals near zero will now be described in more detail. It is known that such a code exhibiting less bit inversion between positive and negative signals near zero is obtained in the form of a signed absolute value code which is expressed with a sign and the absolute value of a number, a Gray code which differs in only one bit from an adjacent code, and so on. FIG. 3 is a table showing the conversion of decimal numbers from −8 to 8 to two's complementary codes, signed absolute value codes, and two different Gray code representations. The expressions in the same row are equivalent to each other. As apparent, both the Gray code and the signed absolute value code exhibit less bit inversion between positive and negative signals near zero while the two's complement code shows a larger number of bits inverted between positive and negative signals. The conversion of an n-bit two's complement code (n is a natural number) expressed as $a=(a[n-1],a[n-2],\ldots a[1],a[0])$ into a signed absolute value or Gray code expressed as $b=(b[n-1], b[n-2], \ldots b[1],b[0])$ is executed using the following procedures. It is assumed that $a[i]$ and $b[i]$ (where i is an integer from 0 to n−1) represent the i-th bit from the most significant bit of their respective codes. NOT is a denial logic and XOR is an exclusive-OR logic.

i) Conversion from two's complement to signed absolute value $b[n-1]=a[n-1]$,
if $a[n-1]=0$ then $b[i]=a[i]$ for $0 \leq i < n-1$, else $b[i]=$NOT $a[i]$ for $0 \leq i < n-1$.

ii) Conversion from two's complement to Gray code 1

$b[n-1]=a[n-1]$, $b[i]=a[i+1]$ XOR $a[i]$ for $0 \leq i < n-1$ iii) Conversion from two's complement to Gray code 2

After a bit form of $2^{n-1}$ or $(1,0,0,\ldots,0)$ is added to the input code "a", the same procedure as of ii) is performed.

Figure 6:
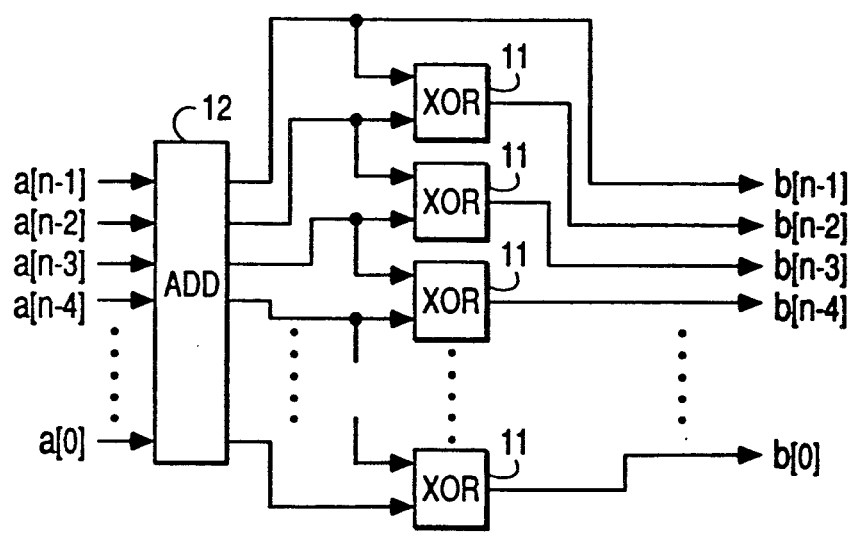
FIGS. 4, 5, and 6 are block diagrams of discrete arrangements of a fixed length code encoder for producing fixed length codes shown in FIG. 3.
Figure 4:
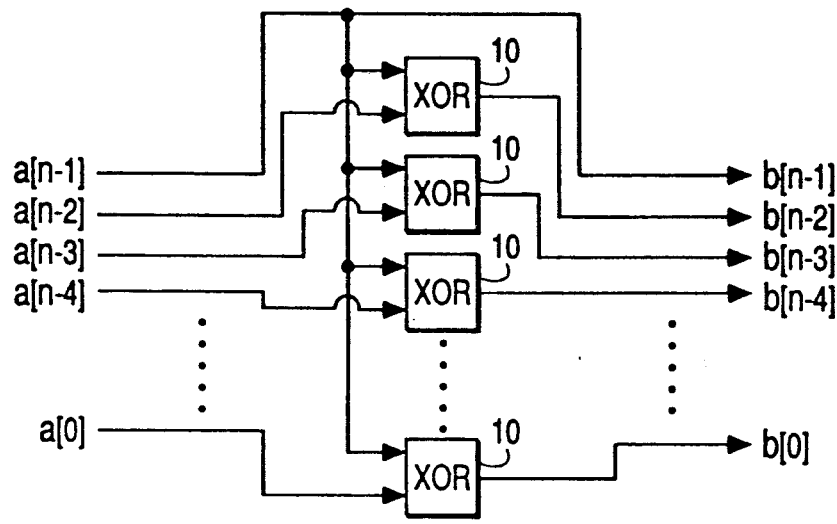

The arrangements of three different fixed length code encoders for performing the foregoing conversion procedures are illustrated in FIGS. 4, 5, and 6 respectively. As shown in FIG. 4, $a[n-2]$ to $a[0]$ of the input signal are fed to corresponding exclusive-OR circuits 10 which perform exclusive -OR operation with $a[n-1]$ and then deliver $b[n-2]$ to $b[0]$ respectively. As understood, $b[n-1]$ is identical to $a[n-1]$. The bit $b[n-1]$ shown in FIG. 4 represents a sign of plus or minus while the remaining bits $b[n-2]$ to $b[0]$ exhibit an absolute value. As shown in FIG. 5, $a[n-2],a[n-3],\ldots,a[i],\ldots,a[1],a[0]$ of the input signal are fed to corresponding exclusive-OR circuits 11 which perform exclusive-OR operation with their respective upper bits $a[n-1]$, $a[n-2],\ldots,a[i+1],\ldots,a[2],a[1]$ and then, produce $b[n-2], b[n-3], \ldots,b[i],\ldots,b[1],b[0]$ respectively. Also, $b[n-1]$ is identical to $a[n-1]$ representing a plus or minus sign. As shown in FIG. 6, a bit form of $2^{n-1}$ is first added to the input signal "a" by an adder 12. Each output bit from the adder 12 is fed to an exclusive-OR circuit 11 for exclusive-OR operation which is the same a portrayed in FIG. 5.

A reverse of the foregoing or the conversion of a code exhibiting less bit inversion between positive and negative signals near zero to a two's complement code will be described. The conversion of an n-bit signed absolute value or Gray code (n is a natural number) expressed as $a=(a[n-1], a[n-2],\ldots a[1],a[0])$ into a two's complement code expressed as $b=(b[n-1],b[n-2],\ldots b[1],b[0])$ is executed using the following procedures. It is assumed that $a[i]$ and $b[i]$ (where i is an integer from 0 to n−1) represent the i-th bit from the least significant bit of their respective codes. NOT is a denial logic and XOR is an exclusive-OR logic.

iv) Conversion from signed absolute value to two's complement $b[n-1]=a[n-1]$,
if $a[n-1]=0$ then $b[i]=a[i]$ for $0 \leq i < n=1$,
else $b[i]=$NOT $a[i]$ for $0 \leq i < n-1$.

v) Conversion from Gray code 1 to two's complement $b[n-1]=a[n-1]$, $b[i] = a[i+1] \text{XOR } a[i]$ for $0 \leq i < n-1$.

vi) Conversion from Gray code 2 to two's complement

After the same procedure as of v) is performed with the input code "a", a bit form of $2^{n-1}$ or $(1,0,0,\ldots,0)$ is subtracted.

Figure 7:
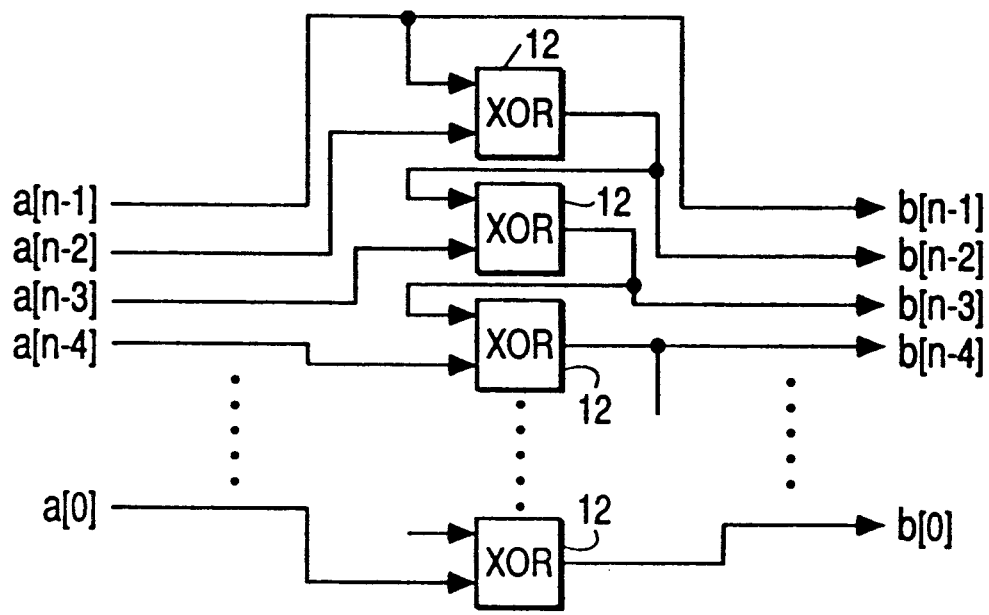
FIGS. 7 and 8 are block diagrams of discrete arrangements of a fixed length code decoder for decoding a fixed length code signal.
Figure 8:
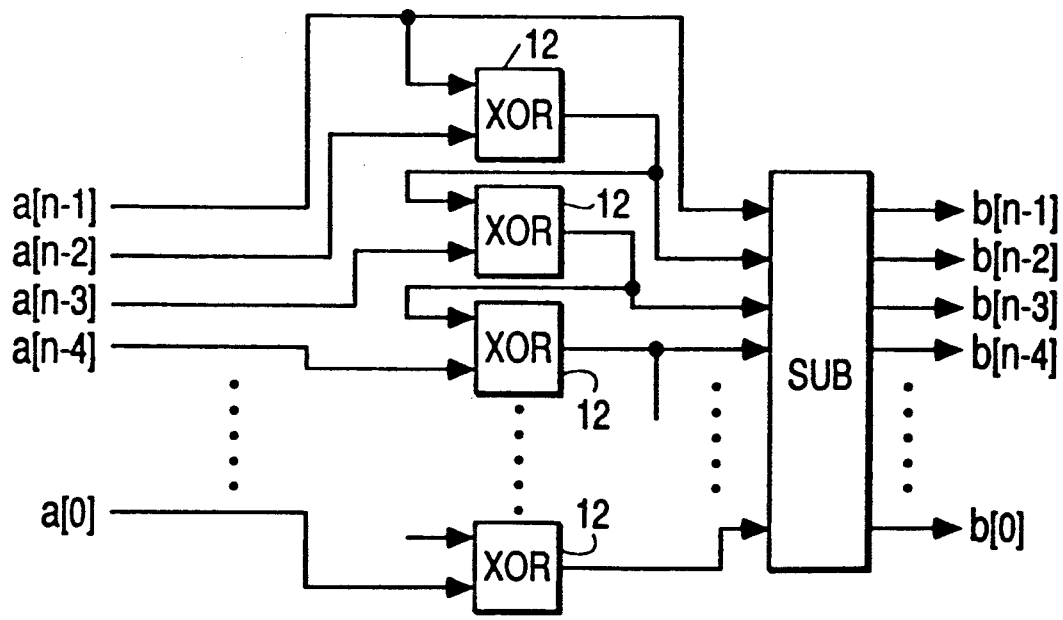

The procedure iv) of converting a signed absolute value code to a two's complement code is similar to a conversion of the two's complement code to a signed absolute value explained in i) and can be executed using the arrangement shown in FIG. 4. The arrangement of a fixed length code decoder for performing the conversion v) of Gray code 1 to two's complement is illustrated in FIG. 7 in which $b[n-1]$ is identical to $a[n-1]$ as known. The other bits $a[n-2], a[n-3], \ldots, a[i], \ldots, a[1], a[0]$ of the input signal are fed to corresponding exclusive-OR circuits 12 which perform exclusive-OR operation with decoded forms $b[n-1], b[n-2], \ldots, b[i+1], \ldots, b[2], b[1]$ of their respective upper bits and then, produce $b[n-2], b[n-3], \ldots, b[i], \ldots, b[1], b[0]$ respectively. FIG. 8 shows the arrangement of a fixed length code decoder for performing the conversion iv) of Gray code 2 to two's complement. The operation before a subtracter 13 in FIG. 8 is similar to that shown in FIG. 7. The subtracter 13 performs subtraction of $2^{n-1}$ from the value of an input signal.

Figure 9:
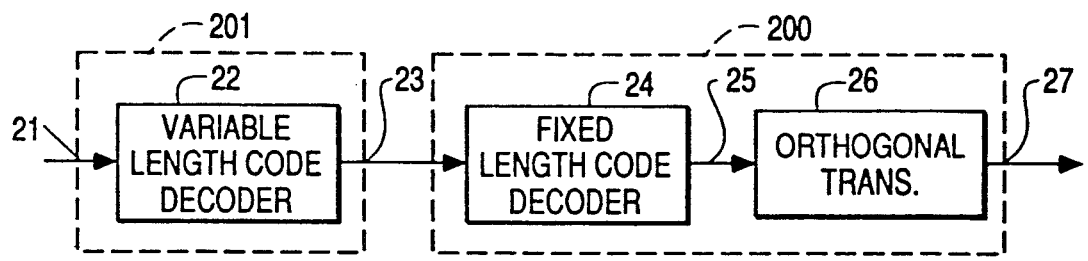
FIGS. 9 and 10 are block diagrams of an orthogonal transformer device showing a second embodiment of the present invention.

FIG. 9 is a block diagram of an orthogonal transformer device showing a second embodiment of the present invention. Shown in FIG. 9 are an input code signal 21 variable length encoded by a variable length code encoder, a variable length code decoder 22 for variable length decoding the input code signal, an output signal 23 of the variable length code decoder 22 exhibiting less bit inversion between positive and negative signals near zero, a fixed length code decoder 24 for fixed length decoding the output signal 23, a two's complement signal 25 which is a decoded output from the fixed length code decoder 24, an orthogonal transformer 26 for processing the two's complement signal 25 by orthogonal transformation, and an orthogonal transformation signal 27 output from the orthogonal transformer 26. In particular, the fixed length code decoder 24 and the orthogonal transformer 26 constitute in combination an orthogonal transformer device 200 of the present invention. The variable length code decoder 201 forms a variable length code decoder device 201. Using the foregoing arrangement shown in FIG. 9, the code signal 7 from the arrangement of the first embodiment shown in FIG. 1 can be decoded. Similar to that in FIG. 1, each group of components defined by a rectangular shape of the dotted line in FIG. 9 represents a fundamental unit arranged on a single integrated circuit element.

The operation of the foregoing arrangement illustrated in FIG. 9 will now be explained. The input signal 21 is a variable length code signal similar to the signal 7 shown in FIG. 1. Hence, the decoded signal 23 from the variable length code decoder 22 exhibits less bit inversion between positive and negative signals near zero, like the output signal 5 shown in FIG. 1. The decoded signal 23 is so far not of two's complement and thus, converted by the fixed length code decoder 24 to a two's complement signal which will then be processed with ease at the orthogonal transformer 26.

Figure 10:
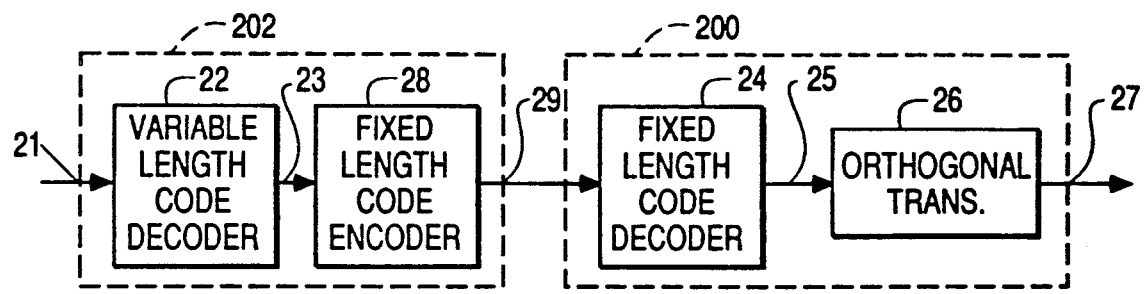

If the decoded signal 23 from the variable length code decoder 22 is of two's complement rather than a less bit inversion signal exhibiting less bit inversion between positive and negative signals near zero, its value is in proximity to zero so that more bit inversion between positive and negative signals can be involved and will thus produce a more number of noise signals. For compensation, a fixed length code encoder 28 may be arranged after the variable length code decoder 22 as shown in FIG. 10. The two components 22 and 28 thus constitute in combination a variable length code decoder device 202. When the orthogonal transformer device 200 and the variable length code decoder device 202 are arranged on a couple of elements respectively, inversion of bits from 0 to 1 or vice versa during data transmission between the two devices 200 and 202 will be decreased thus minimizing development of noise.

What is claimed is:

1. An orthogonal transformer device comprising:
    an orthogonal transformer for processing a digital blocked signal of two's complement by orthogonal transformation; and
    a fixed length code encoder for converting the two's complement signal orthogonal transformed by the orthogonal transformer into a fixed length code signal which exhibits less bit inversion between positive and negative signals near zero.

2. An orthogonal transformer device according to claim 1, wherein the fixed length code encoder is arranged for converting the two's complement signal into a fixed length code signal which is expressed by an absolute value of a data and a sign of plus or minus of the data.

3. An orthogonal transformer device according to claim 1, wherein the fixed length code encoder is arranged for converting the two's complement signal into a Gray code signal.

4. An orthogonal transformer device according to claim 1, wherein both the orthogonal transformer and the fixed length code encoder are disposed on a single IC chip.

5. An orthogonal transformer device comprising:
    a fixed length code decoder for converting an input signal exhibiting less bit inversion between positive and negative signals near zero into a digital signal of two's complement; and
    an orthogonal transformer for processing the digital signal of two's complement decoded by the fixed length code decoder by orthogonal transformation.

6. An orthogonal transformer device according to claim 5, wherein the fixed length code decoder is arranged for converting a fixed length code signal expressed by an absolute value of a data and a plus or minus sign of the data into a two's complement signal.

7. An orthogonal transformer device according to claim 5, wherein the fixed length code decoder is arranged for converting a Gray code signal into a two's complement signal.

8. An orthogonal transformer device according to claim 5, wherein both the orthogonal transformer and the fixed length code decoder are disposed on a single IC chip.

* * * * *